United States Patent
Tsunekawa

(10) Patent No.: US 9,449,800 B2
(45) Date of Patent: Sep. 20, 2016

(54) SPUTTERING APPARATUS AND SPUTTERING METHOD

(71) Applicant: CANON ANELVA CORPORATION, Kawasaki-shi (JP)

(72) Inventor: Koji Tsunekawa, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 14/570,473

(22) Filed: Dec. 15, 2014

(65) Prior Publication Data
US 2015/0096881 A1 Apr. 9, 2015

Related U.S. Application Data

(63) Continuation of application No. PCT/JP2013/001095, filed on Feb. 26, 2013.

(30) Foreign Application Priority Data

Jun. 29, 2012 (JP) ................................. 2012-146853
Oct. 23, 2012 (JP) ................................. 2012-233710

(51) Int. Cl.
*C23C 14/34* (2006.01)
*H01J 37/34* (2006.01)
*C23C 14/22* (2006.01)
(Continued)

(52) U.S. Cl.
CPC ......... *H01J 37/3435* (2013.01); *C23C 14/225* (2013.01); *C23C 14/34* (2013.01); *C23C 14/3407* (2013.01); *C23C 14/35* (2013.01);
(Continued)

(58) Field of Classification Search
CPC .................................................. H01J 37/3417
See application file for complete search history.

(56) References Cited

U.S. PATENT DOCUMENTS 8,377,270 B2   2/2013  Tsunekawa
2010/0213047 A1  8/2010  Nagamine et al.
(Continued)

FOREIGN PATENT DOCUMENTS

JP   62-70568 A    4/1987
JP   63-195264 A   8/1988
(Continued)

OTHER PUBLICATIONS

International Search Report issued in PCT/JP2013/001095, dated Jun. 11, 2013 (2 pages).

*Primary Examiner* — Jason M Berman
(74) *Attorney, Agent, or Firm* — Fitzpatrick, Cella, Harper & Scinto

(57) ABSTRACT

An objective of the present invention is to provide a sputtering apparatus capable of obtaining an adequate film thickness distribution on a substrate surface even if a target projection plane is kept from being projected on the substrate. A sputtering apparatus includes: a process chamber; a substrate holder being rotatable in an in-plane direction of the substrate while holding the substrate; and a sputtering cathode located obliquely to the substrate holder, and arranged to incline to the substrate holder. A projection plane of a target holding surface of the sputtering cathode projected in a direction along a center normal line to the target holding surface onto a plane containing a substrate mounting surface of the substrate holder is formed outside the substrate mounting surface of the substrate holder, and the center normal line to the substrate mounting surface and the center normal line to the sputtering cathode are not coplanar.

6 Claims, 12 Drawing Sheets

(51) Int. Cl.
  *C23C 14/50* (2006.01)
  *C23C 14/35* (2006.01)
(52) U.S. Cl.
  CPC ......... *C23C 14/505* (2013.01); *H01J 37/3405* (2013.01); *H01J 37/3417* (2013.01)

(56) References Cited

U.S. PATENT DOCUMENTS

2012/0325651 A1  12/2012  Yamaguchi et al.
2013/0105298 A1  5/2013  Tsunekawa et al.
2015/0101927 A1  4/2015  Yamaguchi et al.

FOREIGN PATENT DOCUMENTS

| JP | 2001-335924 A | 12/2001 |
| JP | 2009-235429 A | 10/2009 |
| JP | 2011-058073 A | 3/2011 |
| WO | 2008/126489 A1 | 10/2008 |
| WO | 2011/117945 A1 | 9/2011 |
| WO | WO 2011122411 A1 * | 10/2011 |

* cited by examiner

SPUTTERING APPARATUS AND SPUTTERING METHOD

CROSS-REFERENCES TO RELATED APPLICATIONS

This application is a continuation application of International Application No. PCT/JP2013/001095, filed Feb. 26, 2013, which claims the benefit of Japanese Patent Application Nos. 2012-146853 filed Jun. 29, 2012 and 2012-233710 filed Oct. 23, 2012. The contents of the aforementioned applications are incorporated herein by reference in their entireties.

TECHNICAL FIELD

The present invention relates to a sputtering apparatus and a sputtering method of forming a thin film by using a sputtering technique (hereinafter, also simply referred to as sputter).

BACKGROUND ART

As a technique for depositing a film with a favorable film thickness distribution on a substrate surface by using a target smaller than the substrate size, widely used is an oblique-incidence rotation sputter technique in which a target is arranged obliquely to the substrate (for example, Patent Document 1).

A magnetron sputter technique has the following problem in the case of depositing an insulating film on a substrate.

In the magnetron sputter technique, particles in plasma generated near a target are made incident to the target, and particles are ejected from a target due to the incidence. In this process, some of the ejected particles become negative ions. These negative ions are accelerated in a direction opposite to the target (namely, a direction toward the substrate) by an electric field formed on a surface of the target.

Such accelerated negative ions damage a film on the substrate in some cases. This problem is particularly noticeable in the case where the target is an insulator. For this reason, for a process requiring particularly fine film quality control, the oblique-incidence rotation sputter technique requires a target to be shifted and arranged away from a substrate in a direction parallel to the substrate surface or to be arranged at a smaller inclination angle to the substrate (in other words, in a state where the target and the substrate are more parallel to each other) so that a projection plane projected in a direction normal to the target at the center toward a substrate surface can be located outside the substrate surface.

CITATION LIST

Patent Document

Patent Document 1: Japanese Patent Application Laid-Open No. 2011-58073.

SUMMARY OF INVENTION

According to the foregoing method, however, a target needs to be arranged further away from the center point of a substrate as the size of the substrate becomes larger. In the oblique-incidence rotation sputter technique in which the target is arranged obliquely to the substrate direction, in particular, the target projection plane is projected more toward the substrate. For this reason, in order to locate the target projection plane off the substrate surface, it is necessary to arrange the target and the substrate away from each other at a large distance, or to arrange the target and the substrate more parallel to each other.

As a result, a deposition amount on a substrate surface at a point far from the target is reduced so much that a satisfactory film thickness distribution cannot be obtained even it the deposition is performed while rotating the substrate.

The present invention was made in view of the foregoing problems, and has an objective to provide a spattering apparatus and method capable of obtaining an adequate film thickness distribution on a substrate surface even if a target projection plane is kept from being projected on the substrate.

In order to solve the foregoing problems, a first aspect of the present invention is a sputtering apparatus including: a process chamber where to process a substrate; a substrate holder arranged inside the process chamber; and a target holder located obliquely to the substrate holder, and facing the substrate holder in an inclined manner, in which a projection plane of a target holding surface of the target holder projected in a direction along a center normal line to the target holding surface onto a plane containing a substrate mounting surface of the substrate holder is formed outside the substrate mounting surface of the substrate holders and a center normal line to the substrate mounting surface and the center normal line to the target holder are not coplanar.

A second aspect of the present invention is a sputtering apparatus including: a process chamber where to process a substrate; a substrate holder arranged inside the process chamber; and a target holder located obliquely to the substrate holder, and facing the substrate holder in an inclined manner. In the sputtering apparatus, provided that; $\theta$ denotes an angle formed by a first line and a center normal line to a target holding surface of the target holder, the first line being a perpendicular line to a plane containing a substrate mounting surface of the substrate holder and passing through a center point or tire target holding surface; and $\omega$ denotes an angle formed by a first plane and a second plane, the first plane containing the first line and a center normal line to the substrate mounting surface, the second plane being parallel to the center normal line to the substrate mounting surface of the substrate holder and containing the center normal line to the target holding surface, the $\theta$ is $15° \leq \theta \leq 60°$, the $\omega$ is $15° \leq |\omega| \leq 75°$, and a projection plane of the target holding surface projected in a direction along the center normal line to the target holding surface onto the plane containing the substrate mounting surface is formed outside the substrate mounting surface of the substrate holder.

A third aspect of the present invention is a sputtering method of performing a sputtering deposition process on a substrate while rotating the substrate by using a target located obliquely to the substrate and arranged to face the substrate in an inclined manner. The method includes performing the sputtering deposition process on the substrate while the substrate is mounted such that a center normal line to a deposition surface of the substrate and a center normal line to a surface of the target are not coplanar, and that a projection plane of the surface of the target projected in a direction along the center normal line to the surface of the target onto a plane containing the deposition surface is formed outside the deposition surface.

According to the sputtering apparatus and method of the present invention, an adequate film thickness distribution on a substrate surface can be obtained even if a target projection plane is kept from being projected on the substrate.

DESCRIPTION OF EMBODIMENTS

Figure 1:
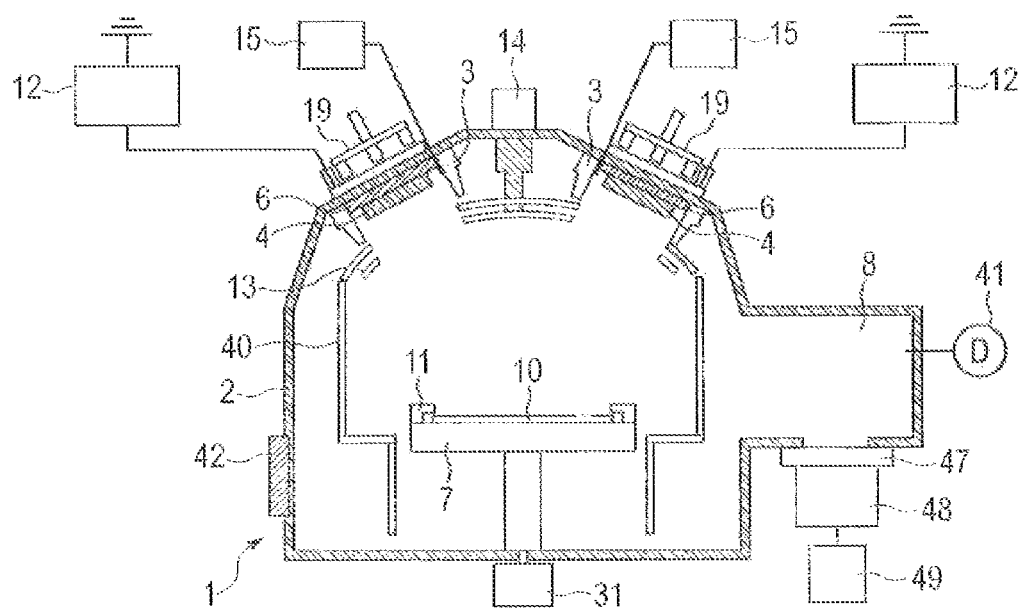
FIG. 1 is a diagram for explaining a sputtering apparatus according to the present invention.

Hereinafter, embodiments of the present invention are described in reference to the drawings. The present invention can be altered variously without departing from the spirit of the present invention. In the drawings described below, the same reference numerals are given to those having the same functions and duplicated explanation is omitted in some cases.

First Embodiment

With reference to FIG. 1, description is provided for an overall configuration of a sputtering apparatus (hereinafter, also referred to as a "deposition apparatus") according to the present embodiment. FIG. 1 is a diagram, schematically illustrating a deposition apparatus 1 according to the present embodiment. The deposition apparatus 1 includes a vacuum chamber 2 as a substrate process chamber. The vacuum, chamber 2 is connected to a vacuum exhauster having a turbomolecular pump 48 and a dry pump 49 for exhausting air from the vacuum chamber 2 through an exhaust port 8. Moreover, the deposition apparatus 1 includes gas introduction mechanisms 15 each capable of introducing a gas for electric discharge into the vacuum chamber 2.

The exhaust port 6 is a duct having a rectangular cross section, for example, and connects the vacuum chamber 2 to the turbomolecular pump 48. A main valve 47 is provided between the exhaust port 8 and the turbomolecular pump 48.

Inside the vacuum chamber 2, a target 4 with a sputter surface exposed is held by each target holder 6. In addition, a substrate holder 7 where to mount a substrate 10 is provided at a predetermined position to be reached by sputter particles ejected from the targets 4. The substrate 10 is loaded in and out via a gate valve 42 provided to the vacuum chamber 2. A mask 11 may be provided around a substrate mounting surface of the substrate holder 7. The mask 11 is configured to prevent a film from being deposited on an edge portion, a side wall, a back surface and the like of the substrate 10. The substrate holder 7 is configured to be capable of rotating the substrate mounting surface on its own axis in a state where the substrate 10 is mounted on the substrate mounting surface, and thereby rotating the substrate 10 along its own plane while mounting the substrate 10 thereon. In the present embodiment, the rotation axis of the substrate holder 7 and the rotation axis of the substrate 10 are located at the same position. The rotation of the substrate holder 7 is controlled by a substrate holder drive mechanism 31.

Besides, the vacuum chamber 2 is provided with, a pressure gauge 41 for measuring pressure in the vacuum, chamber 2. A grounded tubular shield 40 (adhesion preventive shield member) is provided to an inner surface of the vacuum chamber 2. The shield 40 prevents sputter particles from, directly adhering to the inner surface of the vacuum chamber 2. Incidentally, although there are two targets in FIG. 1, the number of targets may be two or more. In addition, although gas inlets are provided besides the two targets, respectively, in FIG. 1, the positions of the gas inlets are not limited to the above but may be any other positions.

The targets 4 are disposed at positions oblique to the substrate 10, and face the substrate 10 in a manner inclined to the substrate 10. The present embodiment uses the targets 4 having smaller diameters than the diameter of the substrate 10. When the targets 4 are provided in the inclined manner at the positions facing the substrate holder 7 and the substrate 10 as described in the present embodiment, a favorable film thickness distribution over the substrate surface can be obtained even if the targets 4 having the small diameters are used. Note that the expression that the target 4 is inclined to the substrate holder 7 and the substrate 10 means that, when a fresh standard target having a flat surface is used, the flat surface and the surface of the substrate 10 are not parallel to each other as illustrated in FIG. 1. A power supply 12 configured to apply power for sputter discharge is connected to each target holder 6. The deposition apparatus 1 illustrated in FIG. 1 includes but not limited to a DC power supply, and may use a RF power supply, for example, if the target 4 is an insulator. In the case of using the RF power supply, a matching circuit needs to be provided between the power supply 12 and the target holder 6. When the power supplies 12 apply voltages to the targets 4, plasma is generated and thereby sputtering is performed. A magnetron unit 19 is provided on a back surface of each target holder 6, and forms magnetic lines of force to confine the plasma to the vicinity of the target 4.

The target holder 6 is insulated from the vacuum chamber 2 by an insulator. The target holder 6 is made of a metal such as Cu, and acts as an electrode when the DC or RF power is applied thereto. Each target 4 is made of a material component desired to be deposited on the substrate, as commonly known. A material component with high purity is desirable, because it affects the purity of the formed film.

A cylindrical adhesion preventive member 3 is provided near each target holder 6 in such a manner as to cover the target holder 6, and prevents sputter, particles from directly adhering to the inner surface of the vacuum chamber 2. In addition, a target shatter 13 may be provided between the target holders 6 and the substrate holder 7. The target shaft is controlled by a target of shutter drive mechanism 14, and is configured to be capable of switching an open state where the target 4 and the substrate 10 face each other and a close state where the target 4 and the substrate 10 are shielded from each other.

The gas introduction mechanism 15 includes a pipe for introducing a gas for electric discharge, a cylinder for storing the gas, a mass flow controller for controlling a gas flow rate, valves for stopping or starting a gas flow, a reducing valve, a filter and the like. In addition, the gas introduction mechanisms 15 each have a configuration capable of feeding a gas stably at an instructed gas flow rate by using a control device.

In this connection, a mixed gas of a gas for electric discharge blended with a reactive gas may be introduced from the gas introduction mechanism 15. Instead, another introduction mechanism for introducing a reactive gas may be provided additionally.

Figure 2:
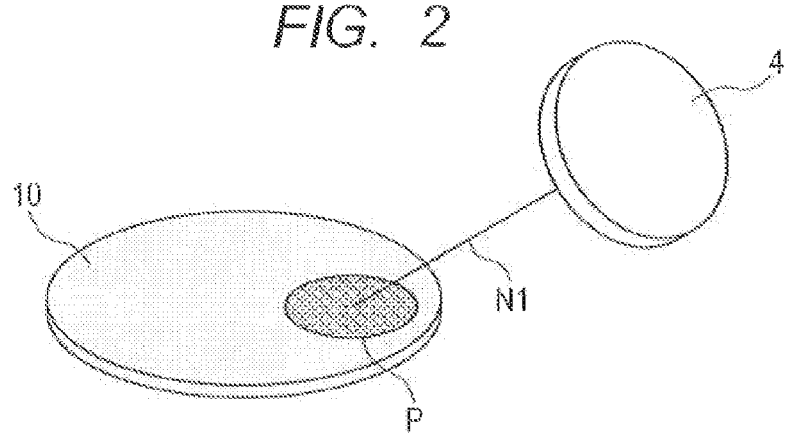
FIG. 2 is a diagram for explaining a positional relationship between a target and a substrate in a conventional sputtering apparatus.
Figure 3A:
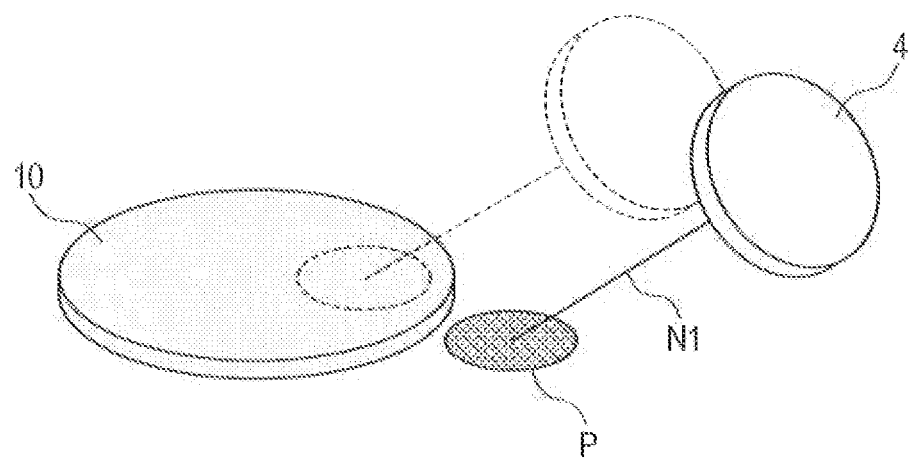
FIG. 3A is a diagram for explaining a method of keeping a target projection plane from being projected on a substrate in a conventional sputtering apparatus.
Figure 3B:
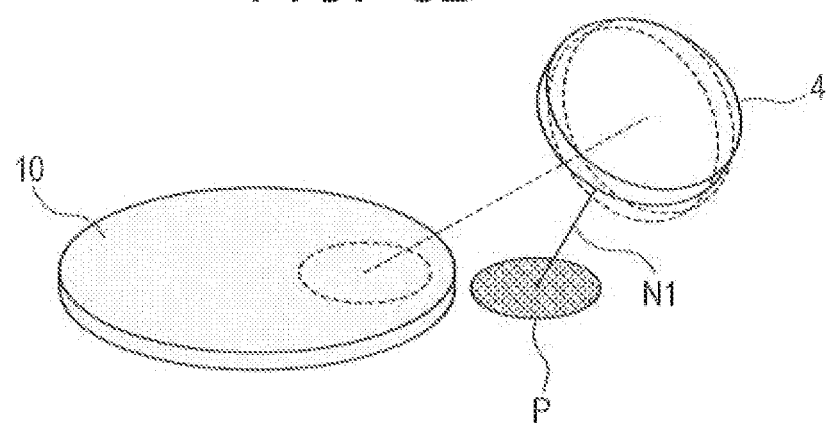
FIG. 3B is a diagram for explaining a method of keeping a target projection plane from being projected on a substrate in a conventional sputtering apparatus.
Figure 4:
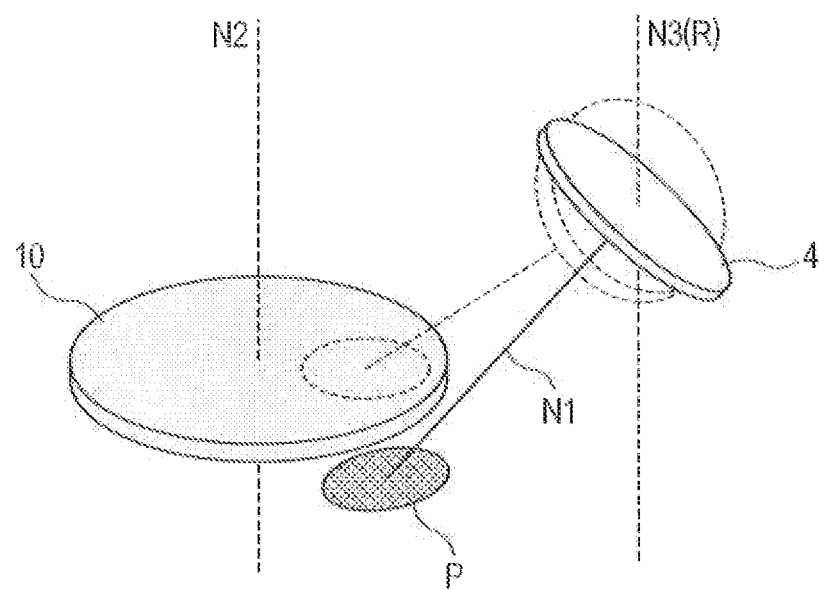
FIG. 4 is a diagram for explaining a positional relationship between a target and a substrate in a sputtering apparatus according to a first embodiment of the present invention.

Next, by using FIGS. 2 to 4, description is provided for a positional relationship between the target 4 and the substrate 10, which is a specific feature of the present invention.

FIGS. 2, 3A and 3B are diagrams for explaining the conventional positional relationships between the target 4 and the substrate 10. In FIG. 2, a projection plane P of the target 4 projected to a plane of the substrate 10 in a direction along a center normal line N1 to the target 4 is projected on the substrate 10. To avoid this, as illustrated in FIG. 3A, the target 4 is shifted away from the substrate 10 in such a manner as to increase the distance between the target 4 and the substrate 10, and thereby the projection plane P is located off the substrate 10. Instead, as illustrated in FIG. 3B, the target 4 is arranged at a smaller inclination to the substrate 10. In the methods illustrated in FIGS. 3A and 3B, a deposition rate has a non-liner, in other words, irregular distribution on the surface of the substrate 10. For this reason, even if the deposition is performed while rotating the substrate holder 7, it is difficult to obtain an even film thickness.

Incidentally, broken lines in FIGS. 3A and 3B indicate the position of the target 4, the position of the normal line N1, and the projection, plane thereof in the state of FIG. 2 on FIGS. 3A and 3B.

FIG. 4 is a diagram for explaining a positional relationship between the target 4 and the substrate 10 according to the present embodiment. In the present embodiment, the target 4 is arranged at a position where the target 4 is rotated about a rotation axis R as compared to the conventional target 4 so that the projection plane P may be located off the substrate 10, in other words, she projection plane P may be formed outside the substrate 10. In FIG. 4, a normal, line N3 is the rotation axis R. The normal line N3 is a normal line to a plane containing the surface of the substrate 10 and passes through the center of the target 4.

Here, the rotation axis R is used to explain the positional relationship between the target 4 and the substrate 10 in the conventional sputtering apparatus, and the positional relationship between the target 4 and the substrate 10 in the sputtering apparatus according to the present embodiment in a comparative manner. In other words, in the sputtering apparatus according to the present embodiment, the target 4 and the target holder 6 holding the target 4 are not actually rotationally driven about the rotation axis R.

When the target 4 is arranged at the position where the target 4 is rotated about the rotation axis R as compared to the convent tonal target 4, the projection plane P can be located off a deposition surface of the substrate 10 without increasing the distance (offset distance) between the center of the target 4 and the substrate 10. As a result, it is possible to perform a deposition process on the substrate 10 with a favorable in-plane distribution while reducing damage on a coating film by negative ions.

Figure 5:
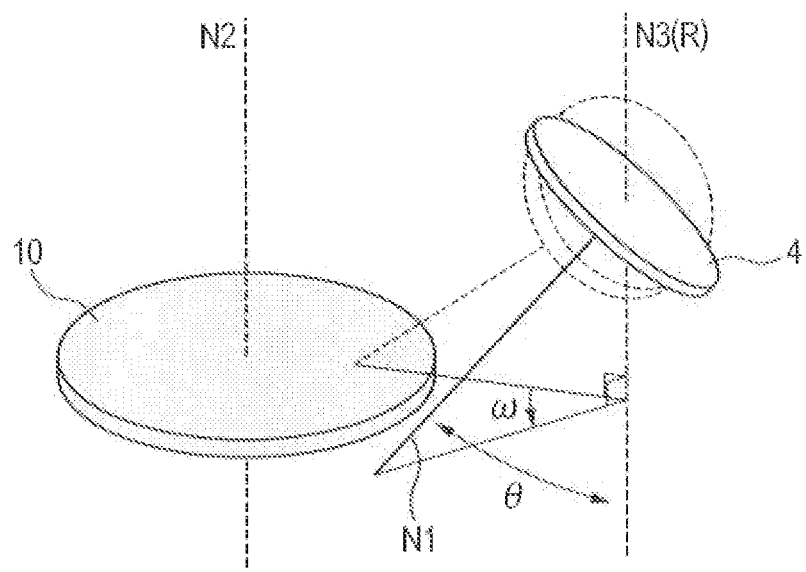
FIG. 5 is a diagram for explaining terms in the specification of the present application.
Figure 6:
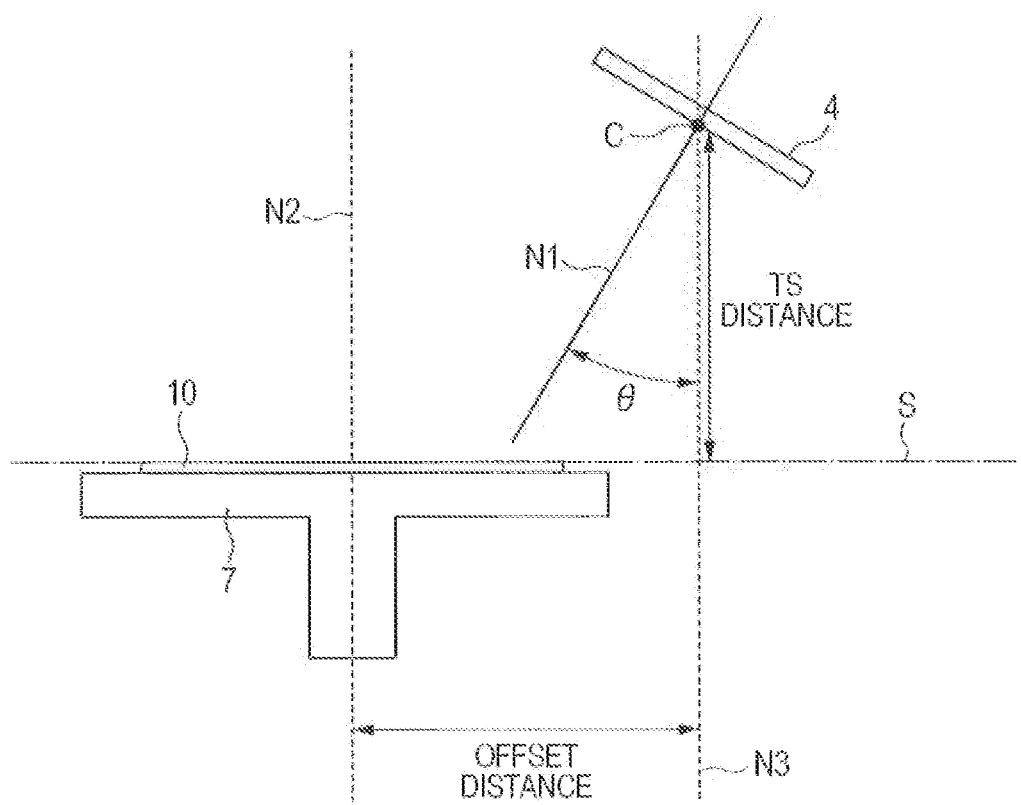
FIG. 6 is a diagram for explaining terms in the specification of the present application.
Figure 7:
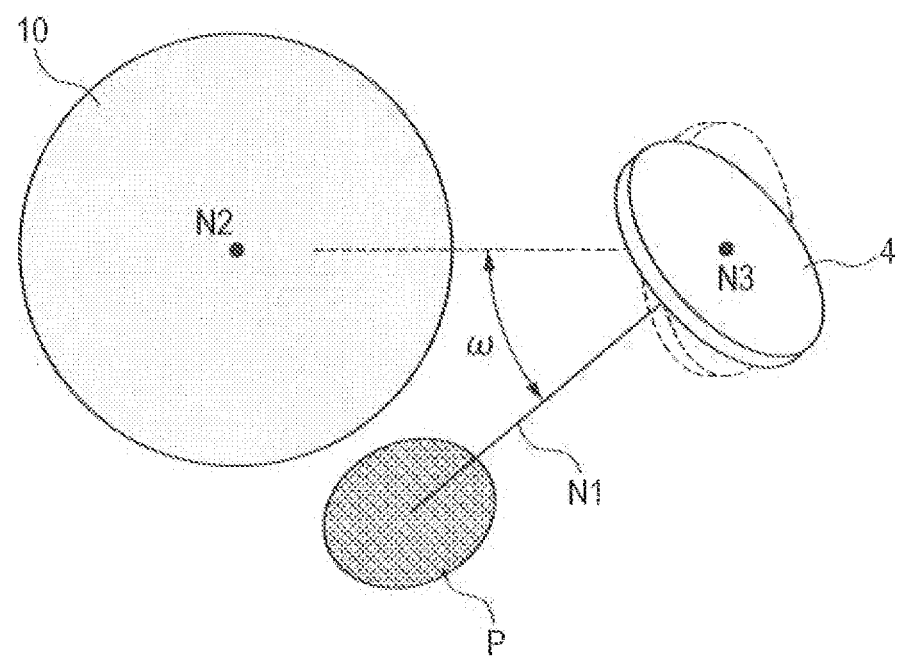
FIG. 7 is a diagram for explaining terms in the specification of the present application.

Here, terms in the specification of the present application are explained by using FIGS. 5 to 7. Firstly, an angle θ is explained by using FIG. 5. The angle θ in a state where the center normal, line N1 to the target 4 lies on the normal line N3 is defined as 0 degrees. Then, θ is defined as an angle formed between the normal line N3 and the center normal line N1 when the normal line N1 is rotated, from the above state, about the center of the surface of the target 4 in an in-plane direction of a plane containing the center normal line N1 and the normal line N3. Then, an angle formed when the normal line N1 is rotated from the state of θ=0° in such a direction that the surface of the target 4 can come to face the surface of the substrate 10 is defined as +, and an angle formed when the normal line N1 is rotated in the reverse direction is defined as −. Accordingly, within a range of 0°<θ<+90°, for example, the center normal line N1 and the center normal line N2 to the substrate 10 cross each other on a substrate 10 side with respect to the target 4 (in the following description, explanation is provided wish the + sign of the angle θ sometimes omitted).

Next, an offset distance and a TS distance are explained by using FIG. 6. The offset distance is a distance between the center normal line N2 to the substrate 10 and the normal line N3. The TS distance is a distance on the normal line N3 from the center position of the surface of the target 4 to a plane S containing the surface of the substrate 10.

Subsequently, an angle ω is explained by using FIGS. 5 and 7.

As illustrated in FIG. 5, the angle ω is a rotation angle of the normal line N1 rotated about the normal line N3 as the rotation axis, where the angle ω in the state where the normal line N1 and the normal line N2 are coplanar is 0 degrees.

Meanwhile, FIG. 7 illustrates a state where the substrate 10 and the target 4 are viewed from an upper side, A supplementary explanation is herein provided on the angle ω by using FIG. 7. The angle ω is also an angle formed between a plain containing the center of the surface of the target 4 and the center normal line N2 to the substrate 10, and a plane which is parallel to the center normal line N2 to the substrate 10 and contains the center normal line N1 to the 4 target. Here, ω is defined as 0 degrees in the state where the normal line N1 and the normal line N2 are coplanar. Accordingly, ω in rotation in one direction is equivalent to ω in rotation, in the opposite direction as long as these rotation angles are the same. For example, in the case where a rotation angle in one of the directions is set to + and a rotation angle in the opposite direction is set to −, +30° and −30° are equivalent to each other.

The angle θ is not particularly limited within a range where the deposition process can be carried out on the substrate 10, but is preferably 15°≤θ≤60° in view of an in-plane distribution of film thickness and a deposition efficiency of sputter particles on the substrate by the deposition on the substrate 10.

Similarly, the angle ω is not particularly limited within a range where the deposition process can be carried, out on the substrate 10, but is preferably 15°≤|ω|≤75° in view of the in-plane distribution of the film thickness and the deposition efficiency of the sputter particles on the substrate by the deposition on the substrate 10.

Note that, as similar to the rotation axis R, the angle θ and the angle ω are used to explain the positional relationship between the target 4 and the substrate 10 in the sputtering apparatus according to the present embodiment. In other words, in the sputtering apparatus according to the present embodiment, the target 4 and the target holder 6 are not actually rotated in the directions of the angle θ and the angle ω.

The center normal line to the substrate 10 is a line perpendicular to the deposition surface of the substrate 10 at the center point of the substrate 10. Then, the center normal line to the target 4 is a line perpendicular to the sputter surface of the target 4 at the center point of the sputter surface of the target 4. Here, the sputter surface of the target 4 is of a target in which a surface yet to be used is flat. In the case where the surface of the target 4 is machined in a predetermined shape, the perpendicular line is obtained based on the back surface of the target 4, a flat surface of the target holder 6 or the like.

In a general sputtering apparatus, the size of the substrate 10 mountable on the substrate holder 7 is limited by the structure of the substrate holder 7, other general component parts (for example, the form, of the gate valve or the form of a substrate transport robot), and others. In addition, also for the target holder 6, the form of the target 4 that can be held by the target holder 6 is limited by other general component parts (for example, means for fixing the target, the form or the target holder 6 or the shield around the outer periphery), and others.

Hence, in order to locate the projection plane P of the target 4 off the surface of the substrate 10, the apparatus may be configured such that, when a target holding surface where to hold the target 4 in the target holder 6 is projected in a direction along the center normal line to the target holding surface onto a plane containing the substrate mounting surface where to mount the substrate 10 in the substrate holder 7, the obtained projection plane can be located off she substrate mounting surface, in other words, the projection plane can be formed outside the substrate mounting surface.

Second Embodiment

Figure 8:
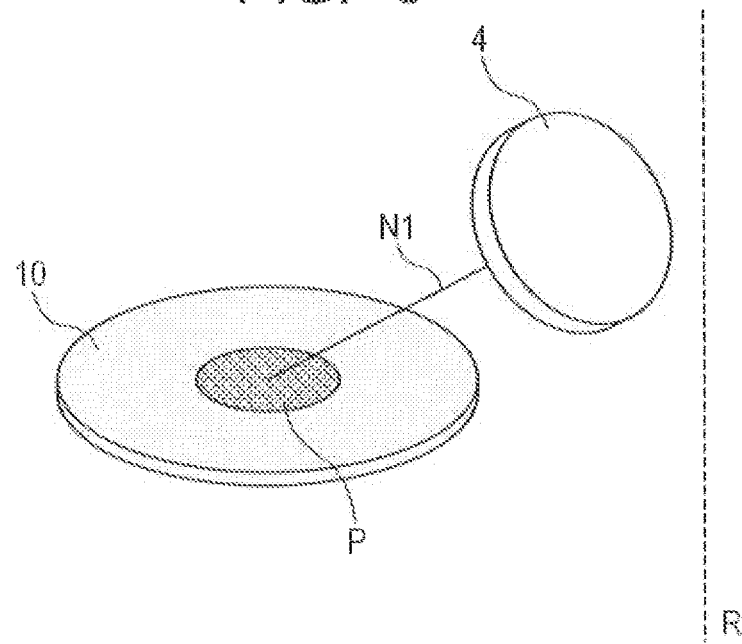
FIG. 8 is a diagram for explaining a positional relationship between a target and a substrate in a spattering apparatus according to a second embodiment of the present invention.
Figure 9:
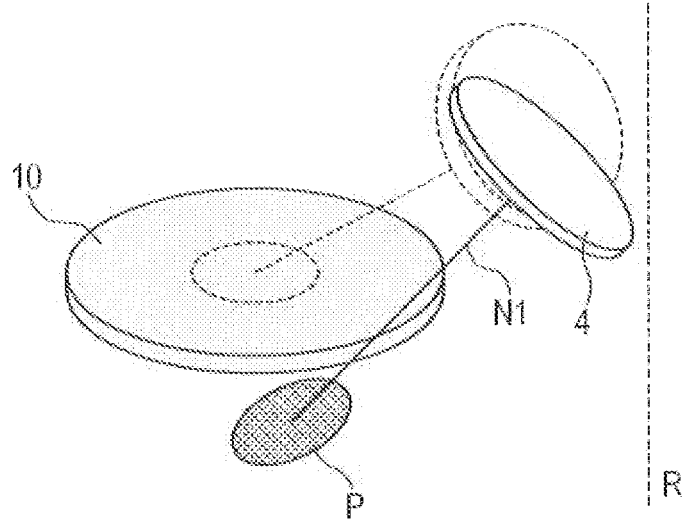
FIG. 9 is a diagram for explaining a positional relationship between a target and a substrate in the sputtering apparatus according to the second embodiment of the present invention.

In the first embodiment, the mode is described where the line passing through the center of the target 4 is used as the rotation axis R. In the present embodiment, a case where the rotation axis R is not a line passing through a target 4 is described by using FIGS. 8 and 9. FIG. 8 illustrates a state where a projection plane P is projected on a substrate 10. In the present embodiment, as illustrated in FIG. 9, the target 4 is arranged at a position where the target 4 is rotated from the state illustrated in FIG. 8 about a rotation axis R not passing through the center of the target 4, and the projection plane P is located outside the surface of the substrate 10. Here, the rotation axis R is a certain normal line to a plane containing the surface of the substrate 10.

Figure 10:
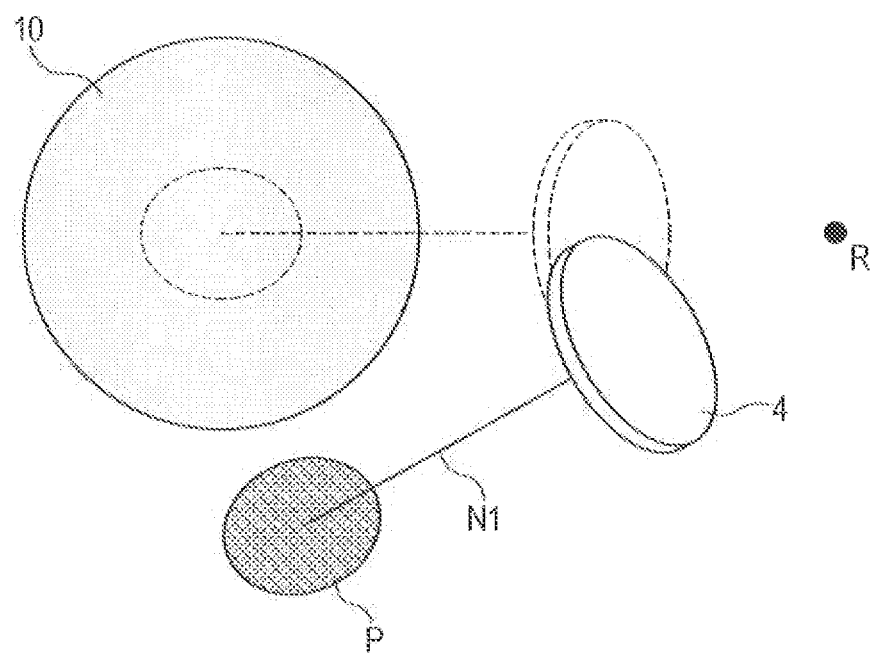
FIG. 10 is a diagram for explaining a positional relationship between a target and a substrate in the sputtering apparatus according to the second embodiment of the present invention.
Figure 11:
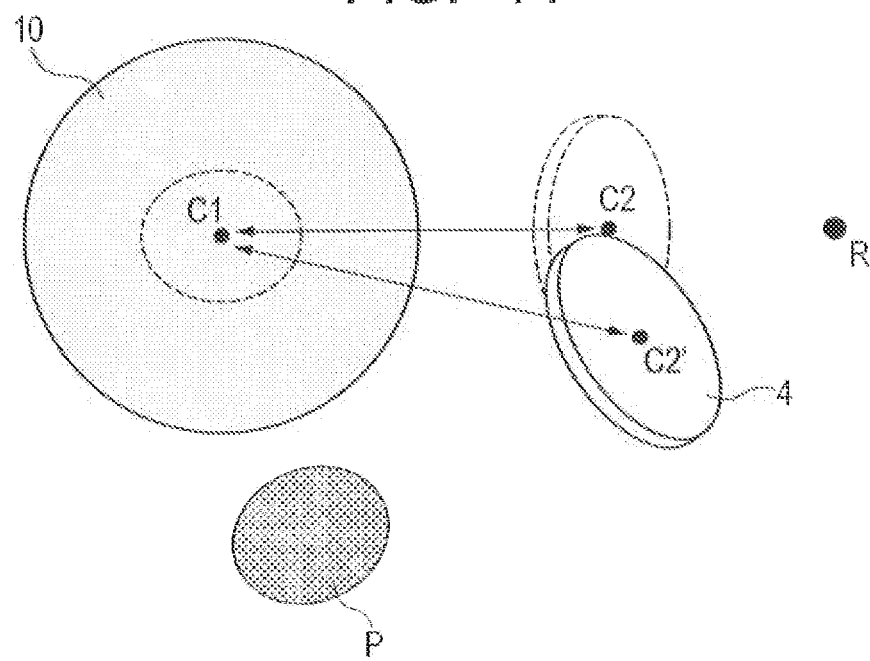
FIG. 11 is a diagram for explaining a positional relationship between a target and a substrate in the sputtering apparatus according to the second embodiment of the present invention.

Note that the first embodiment and the present embodiment are the same in nature. FIG. 10 illustrates a positional relationship between the target 4 and the substrate 10 according to the present embodiment. Broken lines represent the state illustrated in FIG. 8, and solid lines represent the state illustrated in FIG. 9. In this case, it can be seen that the offset distance is changed with the rotation about the rotation axis R as illustrated in FIG. 11. Specifically, it can be seen that a distance between the center C1 of the substrate 10 and the center C2 of the target 4 in the case where the projection plane P exists on the substrate 10 is changed to a distance between she center C1 and the center C2' in the case where the projection plane P does not exist on the substrate 10.

Accordingly, the present embodiment can be considered to be the same in nature as the first embodiment. The present embodiment can be considered as one in which the center C2 is moved to the center C2' (the offset distance is changed) and thereafter the target 4 is arranged at a position where the target 4 is rotated about a line passing through the center C2' as the rotation axis R, as illustrated in FIG. 11. In short, the present embodiment is that both the offset distance and the angle ω are changed. According to the present embodiment, since not only the offset distance but also the angle ω is changed, it is possible to keep the projection plane P from being laid on the surface of the substrate 10 while reducing an increase amount of the offset distance as compared to the conventional method where only the offset distance is changed.

Third Embodiment

Figure 12:
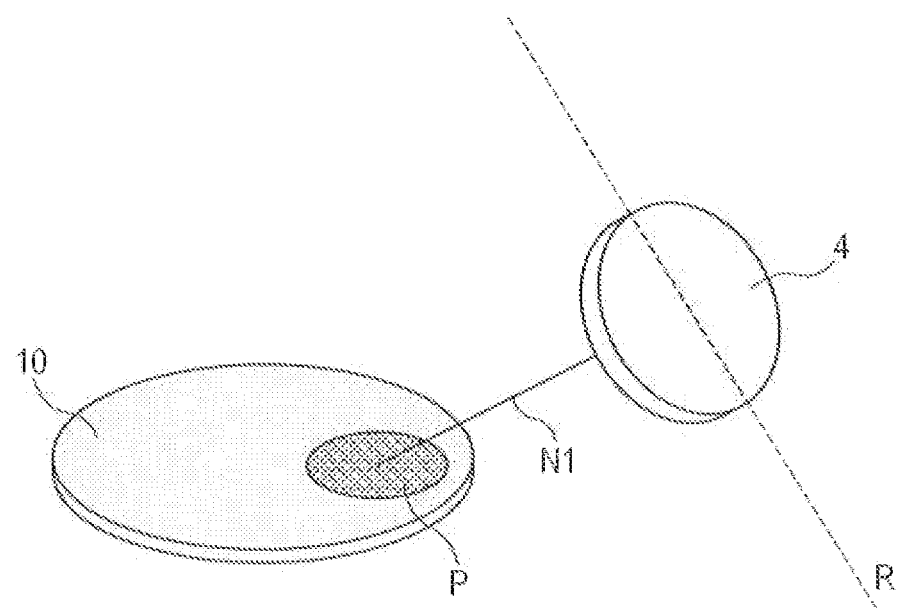
FIG. 12 is a diagram for explaining a positional relationship between a target and a substrate in a sputtering apparatus according to a third embodiment of the present invention.
Figure 13:
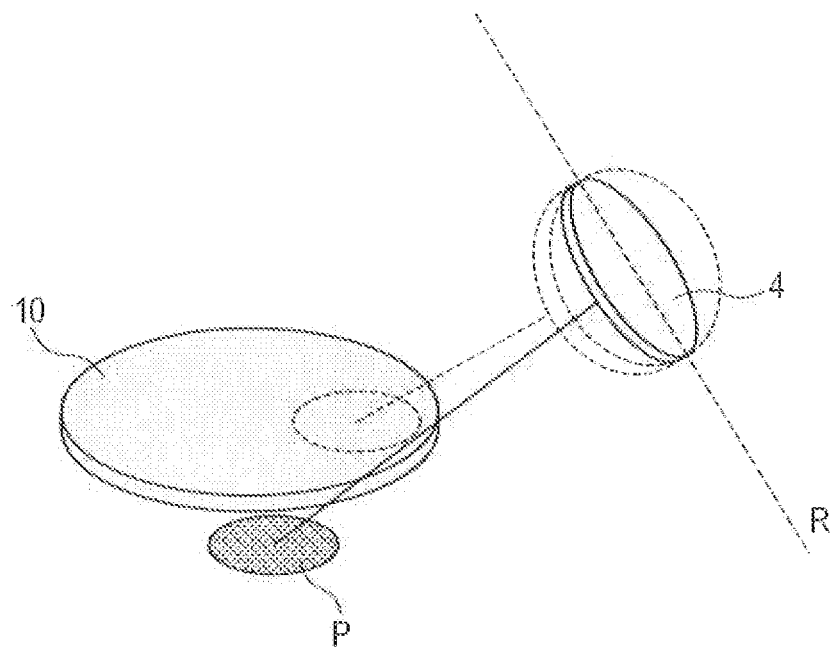
FIG. 13 is a diagram, for explaining a positional relationship between a target and a substrate in the sputtering apparatus according to the third embodiment of the present invention.

In the foregoing embodiments, the normal line to the plane containing the surface of the substrate 10 is used as tree rotation axis R. In the present embodiment, a line parallel to a plane of a target 4 is used as a rotation axis R. The present embodiment is described by using FIGS. 12 and 13. FIG. 12 illustrates a state where a projection plane P is projected on a substrate 10, as in FIG. 8. As illustrated in FIG. 13, when the target 4 is arranged at a position where the target 4 is rotated about the rotation axis R, the projection plane P is located outside the surface of the substrate 10.

The present embodiment is also the same as the first embodiment in nature. In the present embodiment, since the line parallel to the plane of the target 4 is used as the rotation axis R, the angle θ is also changed. In short, the present embodiment can be said to be that both the angle θ and the angle ω are changed from the reference state illustrated in FIG. 12.

In the first to third embodiments described above, the target 4 is arranged at a position where the target 4 is rotated about the rotation axis R by using, as the rotation axis R, a line having a component of a direction normal to the plane of the substrate 10, so that the projection plane P is located off the surface of the substrate 10.

More specifically, in the conventionally employed method, the target 4 is shifted away from the substrate or the angle θ is reduced in order that the projection plane P can be located off the surface of the substrate 10. This angle θ can be said to mean that the target 4 is arranged at the position where the target 4 is rotated about the rotation axis by using, as the rotation axis, a line parallel to the plane of the substrate 10. In contrast to this, in the present invention, the line having the component of the direction normal to the plane of the substrate 10 is used, as the rotation axis R. With this configuration, it is possible to keep the projection plane P from being laid on the surface of the substrate 10 without changing the offset distance between the target 4 and the substrate 10, or with an increase amount of the offset distance reduced as compared to the conventional method. In other words, in order to arrange the target 4 and the substrate 10 such that the projection plane P can be located off the deposition surface of the substrate 10, the normal line N1 and the normal line N2 are set not to exist on a single plane.

In the foregoing embodiments, the target holder 6 may be provided with a target drive unit 9 to adjust the angle ω. With this configuration, the angle ω can be set according to required film characteristics even when a material of a target 4 attached to the target holder 6 is changed. The target drive unit 9 may be further configured to adjust the angle θ.

Instead, in addition to a rotary drive unit for rotating the substrate mounting surface on which the substrate 10 is mounted, the deposition apparatus may include one or more drive units capable of changing the position of the substrate mounting surface relative to the target 4. In this case, the angle ω of the target 4 to the substrate 10 can be adjusted by changing the position of the substrate 10 relative to the target 4 in an in-plane direction of the substrate 10.

In the foregoing embodiments, depending on a certain other treatment process performed on the substrate 10, an outer edge portion with about several millimeters from the outer periphery of the substrate 10 is sometimes discarded without being used for electronic devices or the like. In this case, the projection plane P only has to be located off an effectively-usable area of the substrate 10 which is to be used for manufacturing of electronic devices or the like.

In the foregoing embodiments, the examples where only one target 4 is arranged for the substrate 10 are described, but two or more targets 4 in the first to third embodiments may be arranged. In addition, a deposition process may be performed by simultaneously using two or more targets 4 in the first to third embodiments. For example, two targets 4 according to the first embodiment may be arranged symmetrically to each other with respect to the normal line N2, and a deposition process on a substrate 10 may be performed by sputtering the two targets 4 simultaneously. This configuration enables further improvement in an in-plane distribution on the substrate 10.

Figure 22:
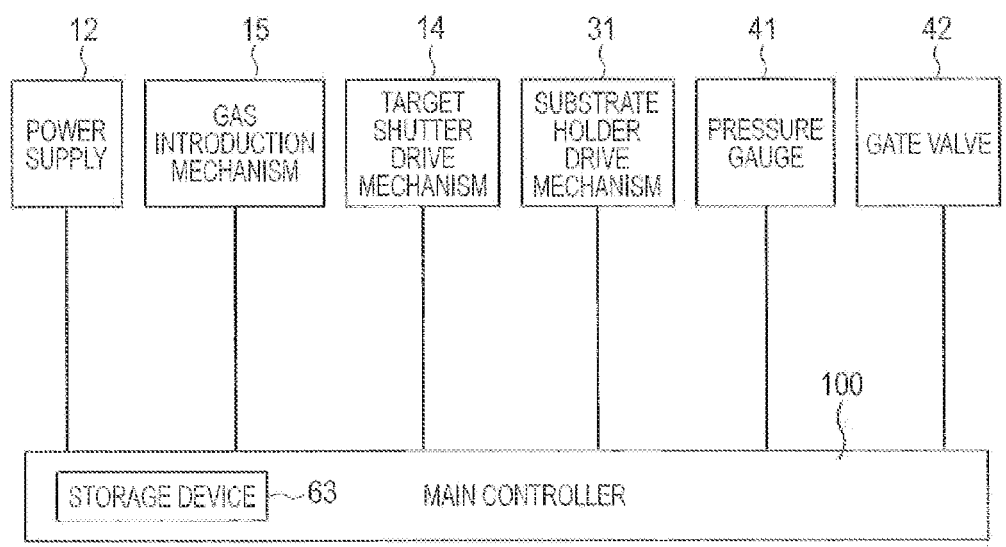
FIG. 22 is a diagram for explaining a controller of a sputtering apparatus according to she present invention.

By using FIG. 22, description is provided for a control device for operating a sputtering apparatus according to the present invention. The control device includes a main controller 100, and a control program for execution of various substrate treatment processes according to the present invention is stored in a storage device 63 included in the main controller 100. For example, the control program may be implemented, as a mask ROM. Instead, the control program may be installed in the storage device 63 constituted by a hard disk drive (HDD) via an external recording medium or network. The main controller 100 is electrically connected to the power supply 12 for applying the power for sputter discharge, the gas introduction mechanisms 15, the substrate holder drive mechanism 31, the target shutter drive mechanism 14, the pressure gauge 41, the gate valve 42 and the like, and is configured to be capable of managing and controlling the operations of the sputtering apparatus.

Example 1

Figure 14:
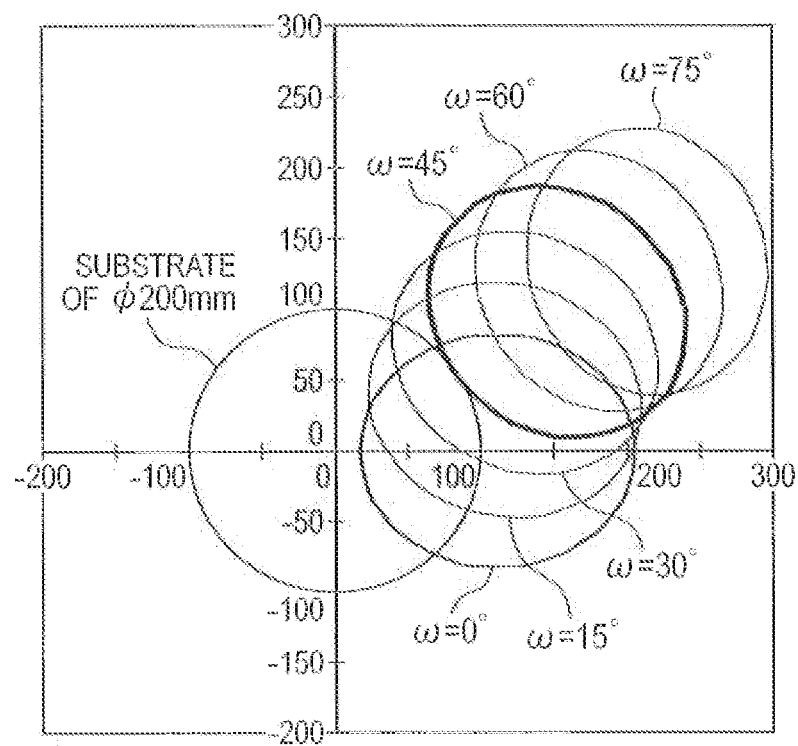
FIG. 14 is a diagram for explaining a first example according to the first embodiment of the present invention.
Figure 15:
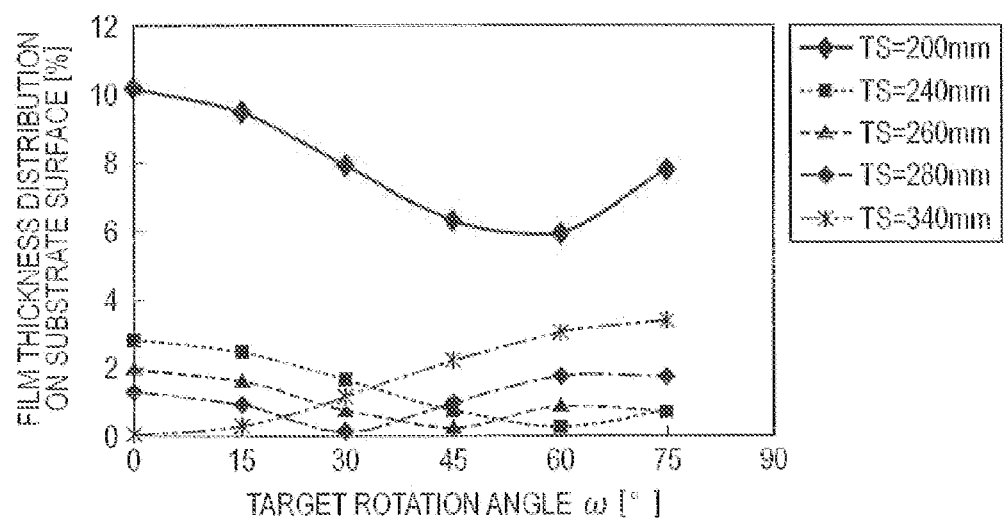
FIG. 15 is a diagram for explaining the first example according to the first embodiment of the present invention.

By using FIGS. 14 and 15, description is provided for a first example obtained by a simulation in the first embodiment.

RF sputter using a MgO target is set as sputter. The diameter of the target is set to 164 mm, and the inclination angle θ of the target to a substrate is set to θ=30°. The diameter of the substrate is set to 200 mm. The offset distance between the target and the substrate is set to 250 mm. The in-plane rotation of the substrate by the substrate holder is set to 60 rpm. Under these conditions, a sputtering deposition process on the substrate 10 is simulated by changing the conditions of the TS distance between the target and the substrate, and the inclination angle ω of the target, and a change in the film thickness distribution on the surface of the substrate among the changed conditions is examined. FIG. 14 presents how the target projection plane P on the substrate 10 and the plane containing the substrate 10 changes when ω is changed. As can be seen from FIG. 14, under the conditions in the first example, the target projection plane is located off the substrate when ω=45° or more.

Next, FIG. 15 presents a change in the film thickness distribution on the surface of the substrate along with the change in ω. Paying attention to ω=45° or more at which the target projection plane is located off the substrate, it can be seen that the film thickness distribution obtained wish the TS distance set to 200 mm is improved in comparison with that at ω=0°. Similarly, it can be seen that the film thickness distributions obtained with the TS distance set to 240 mm and 260 mm are also improved in comparison with that at ω=0°. With the TS distance set to 200 mm and 340 mm, it can be seen that the film thickness distributions at ω=45° or more are slightly poorer than the film, thickness distribution at ω=0° because the latter is good, but the obtained film thickness distributions are still quite good.

Example 2

Figure 16:
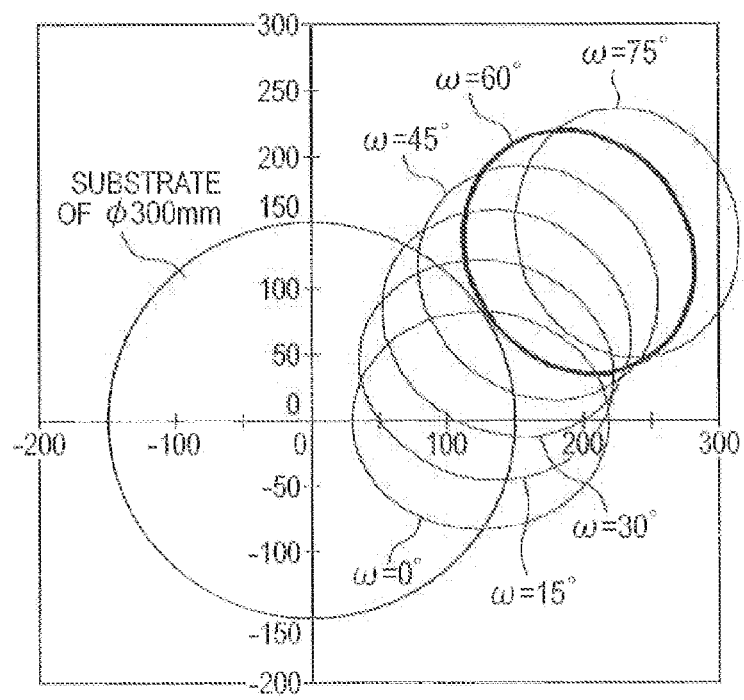
FIG. 16 is a diagram for explaining a second example according to the first embodiment of the present invention.
Figure 17:
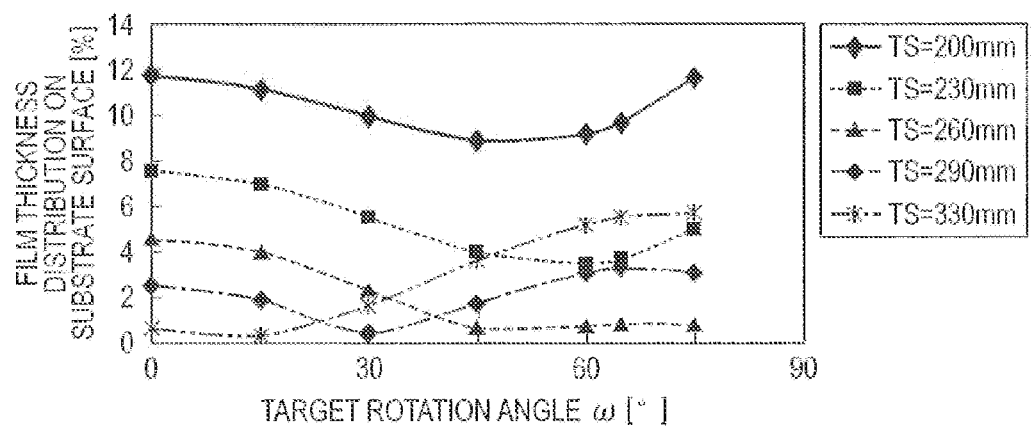
FIG. 17 is a diagram for explaining the second example according to the first embodiment of the present invention.

By using FIGS. 16 and 17, description is provided for a second example obtained by the foregoing simulation in the first embodiment.

RF sputter using a MgO target is set as sputter. The diameter of the target is set to 164 mm, and an inclination angle θ of the target to a substrate is set to θ=30°. The diameter of the substrate is set to 300 mm. The offset distance between the target and the substrate is set to 270 mm. The in-plane rotation of the substrate by the substrate holder is set to 60 rpm. Under these conditions, the sputtering deposition process on the substrate 10 is simulated by changing the conditions of the TS distance between the target and the substrate, and the inclination angle ω of the target, and a change in the film thickness distribution on the surface of the substrate among the changed conditions is examined. FIG. 16 presents how the target projection plane P on the substrate 10 and the plane containing the substrate 10 changes when ω is changed. As can be seen from FIG. 16, under the conditions in the second example, the target projection plane is located off the substrate when ω=60° or more.

Next, FIG. 17 presents a change in the film thickness distribution on the surface of the substrate along with the change in ω. Paying attention to ω=60° or more at which the target projection plane is located off the substrate, it can be seen that the obtained film thickness distribution with a TS distance set to 200 mm is equal to or better than that at ω=0°. With the TS distance set to 230 mm and 260 mm, the obtained film thickness distributions are better than those at ω=0°. With the TS distance set to 290 mm and 330 mm, it can be seen that the film thickness distributions at ω=60° or more are slightly poorer than the film thickness distribution at ω=0° because the latter is good, but the obtained film thickness distributions are still quite good.

As can be understood from the foregoing examples, use of the present invention enables a favorable film thickness distribution to be obtained while reducing film quality deterioration due to negative ions.

In all tire foregoing embodiments and examples, the deposition apparatus 1 is configured such that the projection plane P of the target 4 can be located off the substrate 10. This target 4 can be considered equivalent to a target attachment portion of the target holder 6, and the substrate 10 can be considered equivalent to the substrate mounting surface on the substrate holder 7. The size of a substrate 10 used in the sputtering apparatus may be determined by other general modules used in the usual spattering apparatus. In other words, the substrate mounting surface may be also determined by the other general modules used in the usual sputtering apparatus. Hence, the effects of the invention of the present application can be obtained by setting a predetermined angle ω such that the projection plane of the target attachment portion onto the plane containing the substrate mounting surface can be located off the substrate mounting surface.

Figure 18:
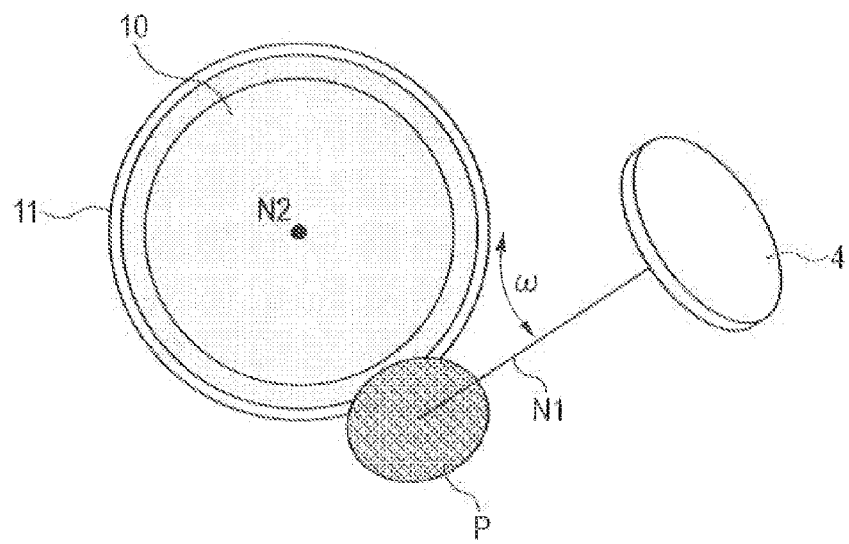
FIG. 18 is a diagram for explaining the present invention.
Figure 19:
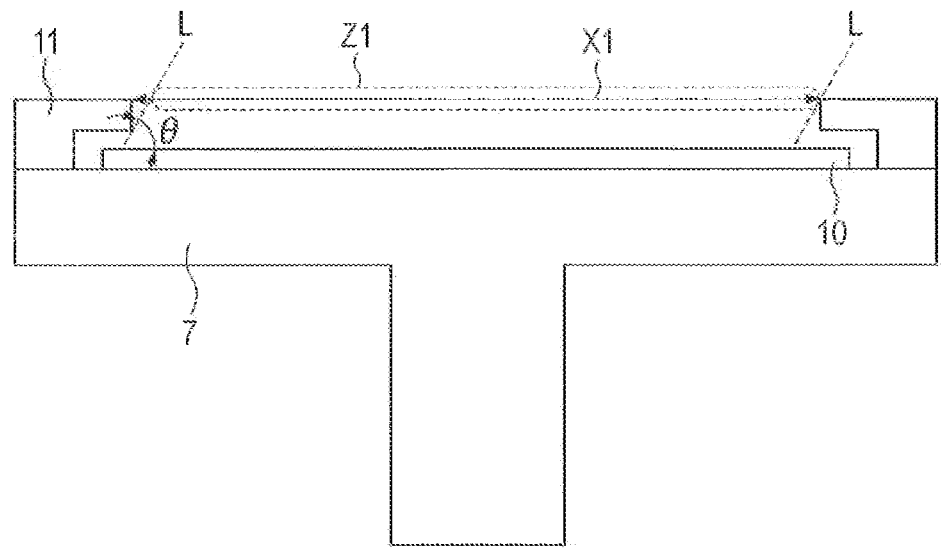
FIG. 19 is a diagram for explaining the present invention.

In addition, if the mask 11 for covering the outer edge of the substrate 10 is provided, the target projection plane P only has to be located off a plane formed by the mask 11. This state is explained by using FIGS. 18 and 15, In FIGS. 18 and 19, the outer edge of the substrate 10 is covered with the mask 11. Incidentally, FIG. 18 illustrates the mask 11 in a translucent manner for the purpose of explaining a positional relationship between the substrate 10 and the mask 11. FIG. 19 is a cross sectional view of the substrate holder 7, the substrate 10 and the mask 11 taken along the plane containing the center normal line N2 to the substrate 10 and the normal line N3. Each of lines L is a line tangent to an edge portion of the mask 11 and has an inclination angle equal to an inclination angle of the target 4 to the substrate 10. In this case, it is necessary to locate the projection plane P of the target 4 off a region Z1 between the lines L within an inner diameter X1 of an upper side of the mask 11, or in other words, to form the projection plane P outside the region Z1. Here, FIG. 19 presents the angle θ. In the case where the mask 11 is provided, a shadow cashed on the surface of the substrate 10 by the mask 11 should be considered to determine both the angle θ and the angle ω.

Figure 20:
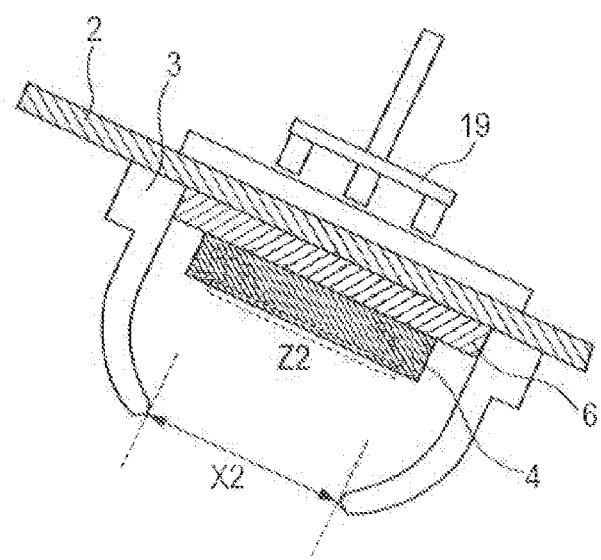
FIG. 20 is a diagram for explaining the present invention.

Similarly, let us consider another case where the adhesion preventive member 3 as provided around the outer periphery of the target 4 and covers a part of the outer edge of the target 4. This state is explained by using FIG. 20. Here, Z2 denotes a region obtained on the target 4 by projecting, perpendicularly onto the target 4, a circle having a diameter X2 formed by the adhesion preventive member 3 with the normal line N1 centered. The target projection plane P is formed by this region Z2. More specifically, in the case where the outer edge of the target 4 is covered with the adhesion preventive member 3, it is merely necessary to locate the target projection piano P formed by the region Z2 off the substrate 10, or in other words, to form the projection plane P outside the substrate 10.

Figure 21:
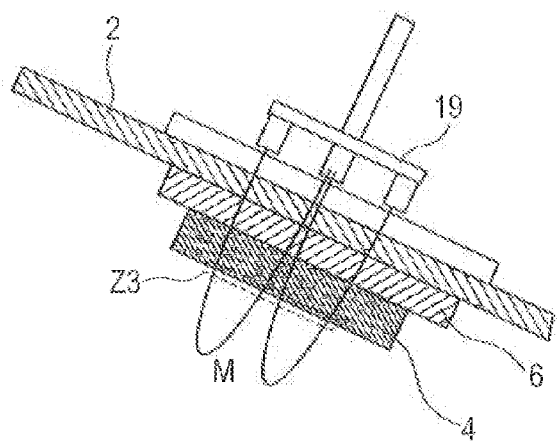
FIG. 21 is a diagram for explaining the present invention.

Next, by using FIG. 21, description is provided for a projection plane P in the case where a magnetron sputtering technique is used as the sputtering method of the target 4. The magnetron unit 19 is arranged on the back surface of the target holder 32 and magnetic lines of force M flowing from magnet portions of the magnetron unit 19 form a magnetic tunnel in the vicinity of the target 4. In the case of using the magnetron sputters the sputter surface of the target 4 is determined by the magnetic lines of force M formed by the magnetron unit 19. More specifically, of the width of the magnetic tunnel portion is smaller than the diameter of the target 4, the sputter surface is smaller than the diameter of the target 4. Accordingly, in FIG. 21, a region Z3 is an actual sputter surface. In this case, the projection plane P is a plane obtained by projecting the region Z3 in the direction along the center normal line to the target 4.

The present invention should not be limited to the foregoing embodiments, but may be altered as needed without departing from the spirit of the present invention.

The invention claimed is:

1. A sputtering apparatus comprising:
   a process chamber where to process a substrate;
   a substrate holder arranged inside the process chamber and being rotatable in an in-plane direction of the substrate while holding the substrate; and
   a target holder located obliquely to the substrate holder, and facing the substrate holder in an inclined manner,
   wherein a projection plane of a target holding surface of the target holder projected in a direction along a center normal line to the target holding surface onto a plane containing a substrate mounting surface of the substrate holder is formed outside the substrate mounting surface of the substrate holder, and
   wherein the substrate holder and the target holder are provided at positions where a center normal line to the substrate mounting surface and the center normal line to the target holder are not coplanar when the substrate holder is rotated in the in-plane direction.

2. The sputtering apparatus according to claim 1, comprising a magnetron unit arranged on a back surface of the target holder.

3. A sputtering apparatus comprising:
   a process chamber where to process a substrate;
   a substrate holder arranged inside the process chamber and being rotatable in an in-plane direction of the substrate while holding the substrate; and
   a target holder located obliquely to the substrate holder, and facing the substrate holder in an inclined manner,
   wherein θ denotes an angle formed by a first line and a center normal line to a target holding surface of the target holder, the first line being a perpendicular line to a plane containing a substrate mounting surface of the substrate holder and passing through a center point of the target holding surface,
   wherein ω denotes an angle formed by a first plane and a second plane, the first plane containing the first line and a center normal line to the substrate mounting surface, the second plane being parallel to the center normal line to the substrate mounting surface of the substrate holder and containing the center normal line to the target holding surface, and wherein when the substrate holder is rotated in the in-plane direction, the θ is 15°≤θ≤60°, the ω is 15°≤|θ|≤75°, and a projection plane of the target holding surface projected in a direction along the center normal line to the target holding surface onto the plane containing the substrate mounting surface is formed outside the substrate mounting surface of the substrate holder.

4. The sputtering apparatus according to claim 3, comprising a magnetron unit arranged on a back surface of the target holder.

5. A sputtering method of performing a sputtering deposition process on a substrate while rotating the substrate in an in-plane direction of the substrate by using a target located obliquely to the substrate and arranged to face the substrate in an inclined manner, the method comprising:

performing the sputtering deposition process on the substrate while the substrate is mounted such that a center normal line to a deposition surface of the substrate and a center normal line to a surface of the target are not coplanar and that a projection plane of the surface of the target projected in a direction along the center normal line to the surface of the target onto a plane containing the deposition surface is formed outside the deposition surface.

6. The sputtering method according to claim 5, wherein the sputtering method is a magnetron sputtering method using a magnetron unit arranged on a back surface of the target holder.

* * * * *